(12) United States Patent
Leprettre et al.

(10) Patent No.: US 6,844,737 B2
(45) Date of Patent: Jan. 18, 2005

(54) DEVICE AND PROCESS FOR DETECTING AN ELECTRICAL SHORT-CIRCUIT, AND CIRCUIT BREAKER COMPRISING SUCH A DEVICE

(75) Inventors: Benoit Leprettre, Saint Martin d'Héres (FR); Pierre Perichon, Voiron (FR); Luc Oriat, Toulouse (FR)

(73) Assignee: Schneider Electric Industries SAS (FR)

(*) Notice: Subject to any disclaimer, the term of this patent is extended or adjusted under 35 U.S.C. 154(b) by 94 days.

(21) Appl. No.: 10/273,978

(22) Filed: Oct. 21, 2002

(65) Prior Publication Data

US 2003/0107380 A1 Jun. 12, 2003

(30) Foreign Application Priority Data

Dec. 6, 2001 (FR) ............................................ 01 15785

(51) Int. Cl.⁷ .................. G01R 31/14; G01R 31/28; G01R 31/08
(52) U.S. Cl. .................. 324/511; 324/500; 324/509; 324/522; 324/524
(58) Field of Search ................................ 324/500, 509, 324/522, 424, 541, 510, 511

(56) References Cited

U.S. PATENT DOCUMENTS 5,905,615 A    5/1999   Rivetti et al. .................. 361/63
6,313,639 B1  11/2001   Griepentrog ................. 325/500

FOREIGN PATENT DOCUMENTS

| DE | 364 2136 A1 | 6/1988 |
| DE | 198 39 616 A1 | 3/2000 |
| EP | 0 838 887 A2 | 4/1998 |
| WO | WO 99/03183 | 1/1999 |

*Primary Examiner*—Anjan Deb
*Assistant Examiner*—John Teresinki
(74) *Attorney, Agent, or Firm*—Parkhurst & Wendel, L.L.P.

(57) ABSTRACT

An electrical short-circuit detection device includes a first signal processing module for receiving a signal representative of an electrical current and supplying a first signal representative of the value of the electrical current and a second signal representative of the differential of the electrical current, and a second processing module for receiving the signals and comprising a short-circuit detection module for supplying a detection signal according to a curve overshoot. The second processing module monitors a limit curve overshoot and a ratio between variations of the signals. A short-circuit detection signal is supplied when the ratio exceeds a preset threshold. A circuit breaker incorporates such a device. The process comprises monitoring limit curve overshoot and the ratio between variations of the signals.

17 Claims, 8 Drawing Sheets

DEVICE AND PROCESS FOR DETECTING AN ELECTRICAL SHORT-CIRCUIT, AND CIRCUIT BREAKER COMPRISING SUCH A DEVICE

TECHNICAL FIELD

The invention relates to a device for detecting an electrical short-circuit comprising:

first signal processing means comprising an input to receive a signal representative of an electrical current, a first output to supply a first signal representative of the value of said electrical current and a second output to supply a second signal representative of the differential of said electrical current, and second processing means receiving said first signal and said second signal and comprising short-circuit detection means supplying a short-circuit detection signal according to a curve overshoot corresponding to combined current and current differential characteristics.

The invention also relates to a process for detecting an electrical short-circuit using a first value of a first signal representative of the value of an electrical current and a second value of a second signal representative of the differential of said electrical current.

The invention also relates to a circuit breaker comprising such a device or implementing such a process.

BACKGROUND ART

Short-circuit detection devices exist that use current differential signals and real current signals to detect a short-circuit. These devices use a non-trip zone represented in an orthogonal coordinates system with a current differential axis and a real current axis. As soon as a passage outside the zone occurs, a short-circuit is detected. If a current represented by a differential signal and a real component signal remains inside the zone, there is no short-circuit detection.

A state-of-the-art Patent application DE 3,642,136 describes a detection device using current differential signals di/dt and current signals i in an electronic trip device to detect a short-circuit. These signals are applied to a monitoring circuit of a trip zone defined in an orthogonal coordinates system.

In a Patent application EP 838,887 and in U.S. Pat. No. 5,905,615, a circuit breaker is described comprising a short-circuit detector using current differential signals (di(t)/dt)/In and current signals i(t)/In. These signals are applied to a monitoring circuit of a zone without short-circuit defined in an orthogonal coordinates system. In this circuit breaker, the short-circuit detector is associated to a device for monitoring selectivity between circuit breakers.

A Patent application WO 9,903,183 describes a detection method and device using current differential signals di/dt and current signals i to detect a short-circuit in a low voltage mains power system. These signals are applied to a monitoring circuit of a zone without short-circuit defined in the orthogonal coordinates system. Particular zone shapes are defined in this document.

A diagram represented in FIG. 1 shows a circuit breaker 1 comprising main conductors 2 connected to breaking contacts 3 enabling an electrical current Ip to be broken in said conductors 2. A current sensor 4 arranged on a conductor 2 enables a signal Is representative of a current Ip flowing in said conductor to be supplied. The signal Is is supplied to a short-circuit detection device 5. Said device 5 comprises a signal processing circuit 6 and a short-circuit detection processing circuit 7. The circuit 6 has an input to receive the signal Is representative of a current flowing in a main conductor and two outputs to supply signals to the circuit 7. A first output supplies a first signal i representative of the instantaneous value of said current Ip and a second output supplies a second signal di/dt representative of the differential of said current Ip.

Said processing circuit 7 receives the signals i and di/dt and supplies a short-circuit detection signal 8 if an overshoot of a curve corresponding to combined current and current differential characteristics occurs. The signal 8 can control a trip relay 9 of an opening mechanism 10 of the contacts 3.

A FIG. 2 shows a type of combined curve used by devices of the prior art. In this figure, a combined curve 11 is plotted on an orthogonal coordinates system having a first axis 12 bearing values representative of current i and a second axis 13 perpendicular to the first axis 12 and bearing values representatives of current differentials di/dt. This curve 11 corresponding to variable thresholds according to the signals i and di/dt bounds a non-trip zone 14 inside said curve and a trip zone 15 outside said curve.

The methods used in state-of-the-art devices enable simple and efficient short-circuit detection to be achieved, but the speed of decision is not sufficient for very fast detection devices. For certain switchgear, known methods are liable to detect a short-circuit whereas the current is already too high. Such a delay is liable to reduce the performances of a switchgear apparatus such as a circuit breaker.

SUMMARY OF THE INVENTION

The object of the invention is to achieve a short-circuit detection device and process enabling very fast detection, and a circuit breaker comprising such an equipment device.

In a detection device according to the invention the second processing means comprise first monitoring means to monitor overshoot of a limit curve and second monitoring means to determine a value representative of a ratio between variations of values depending on the first signal and the second signal when the first processing means detect a limit curve overshoot, a short-circuit detection signal being supplied if the first monitoring means detect an overshoot of said limit curve and if the second monitoring means detect a ratio between variations exceeding a preset threshold value.

Preferably said preset threshold value is equal to or less than zero.

Advantageously, said value representative of said ratio between variations is defined by an angle value determined by a tangent at an overshoot point of the limit curve by a signal representative of said first signal representative of the value of said electrical current and of said second signal representative of the differential of said electrical current.

Preferably said limit curve is formed by at least two segments.

For example, the limit curve comprises a first segment starting at a first current threshold, ending at a second current threshold, and forming a first angle with a first axis representative of current value, and a second segment starting at said second threshold.

Preferably the second segment forms a second angle with the first axis, the second angle being larger than the first angle.

In another preferred embodiment, said limit curve starts at a first threshold and is defined by couples of predefined points.

Advantageously, said limit curve passes between bounds defined by a first curve and a second curve, said first curve having a first segment starting at a first current threshold, ending at a second current threshold, and forming a first angle with a first axis representative of current value, and a second segment starting at said second threshold and forming a second angle with the first axis, the second angle being larger than the first angle, said second curve having a third segment starting at a third current threshold, ending at a fourth current threshold, and forming a third angle with a first axis representative of current value, and a fourth segment starting at said fourth threshold and forming a fourth angle with the first axis, the third threshold being greater than the first threshold, the fourth threshold being greater than the second threshold, and the third angle being smaller than or equal to the first angle.

Preferably, in a coordinates system orthonormed with respect to a nominal operating current, the first threshold is greater than 1, the second threshold is greater than 3.3, the third threshold is smaller than 1.6, the fourth threshold is smaller than 5.3, the first angle is smaller than 70 degrees, and the third angle is larger than 30 degrees.

Advantageously, said limit curve is formed appreciably symmetrically on a first quadrant of positive current and current differential values, and on a third quadrant of negative current and current differential values.

An electrical circuit breaker according to the invention comprises power contacts to break an electrical current, and an electronic trip device comprising current sensors to supply signals representative of currents flowing in the electrical conductors, trip function processing means receiving said signals representative of currents flowing in said electrical conductors and supplying a tripping signal to a trip relay triggering opening of said electrical contacts, the trip device comprising at least one short-circuit detection device as defined above to supply a tripping signal if a short-circuit is detected.

A process for detecting an electrical short-circuit according to the invention comprises:

a first step of determining a first value of a first signal representative of the value of an electrical current and a second value of a second signal representative of the differential of said electrical current, a monitoring step of overshoot of a limit curve by said first value and said second value, a second determination step to determine a value representative of a ratio between variations of said second value of said second signal and variations of said first value of said first signal, and a monitoring step of the value representative of said ratio between variations to supply a short-circuit detection order if said value representative of a ratio exceeds a preset threshold value.

Advantageously, in the second determination step, the value representative of said ratio is determined according to:

a first difference between a sample of said second signal close to an overshoot time of the curve and one of the previous samples of said second signal, and a second difference between a sample of said first signal close to said overshoot time of the limit curve and one of the previous samples of said first signal.

Preferably, in the second determination step, the value representative of said ratio is representative of a tangent formed approximately at the time the limit curve is crossed by a curve representing the first signal and the second signal in an appreciably orthogonal coordinates system.

According to an alternative embodiment, in the second determination step, the value representative of said ratio is representative of an angle formed by a vector representative of a tangent approximately at the time the limit curve is crossed by a curve representing the first signal and the second signal in an appreciably orthogonal coordinates system and a vector parallel to an axis representative of current value.

Preferably, in the monitoring step of overshoot of a limit curve, the limit curve comprises at least two segments.

Advantageously, in the monitoring step of overshoot of a limit curve, the limit curve is defined by predetermined couples of points.

BRIEF DESCRIPTION OF THE DRAWINGS

Other advantages and features will become more clearly apparent from the following description of particular embodiments of the invention given as non-restrictive examples only and represented in the accompanying drawings in which.

DETAILED DESCRIPTION OF PREFERRED EMBODIMENTS

Figure 1:
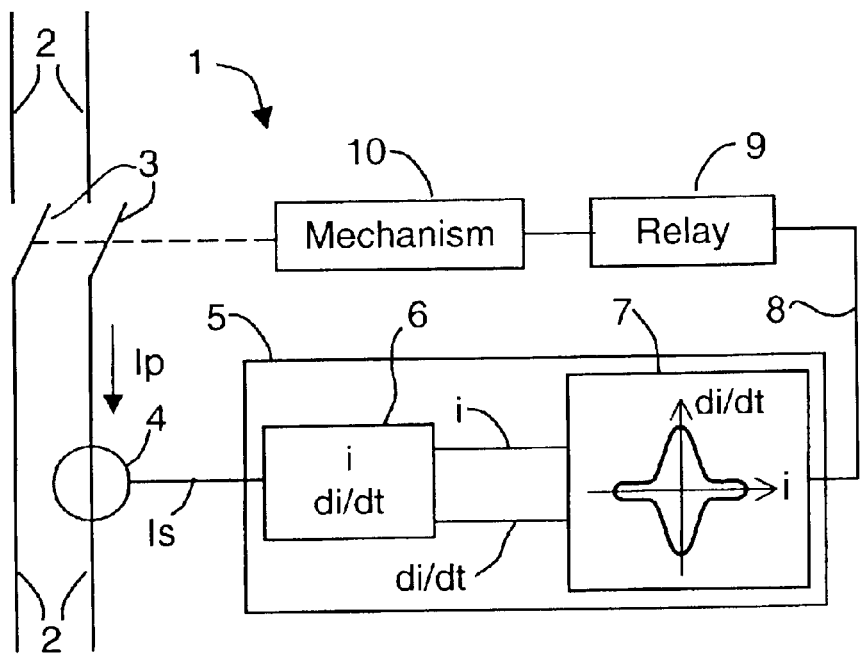
FIG. 1 represents a diagram of a circuit breaker with a short-circuit detection device of the prior art.
Figure 2:
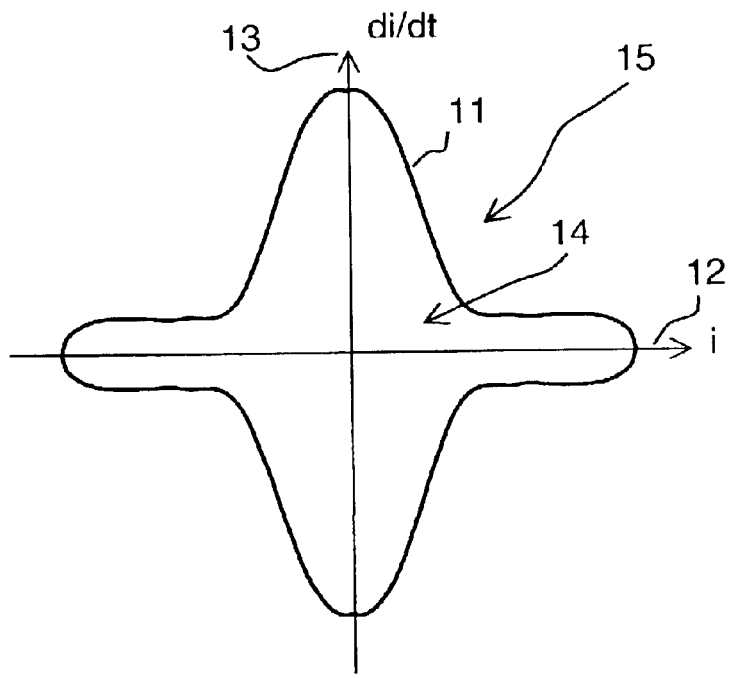
FIG. 2 represents a graph of a detection threshold curve of the prior art.
Figure 3:
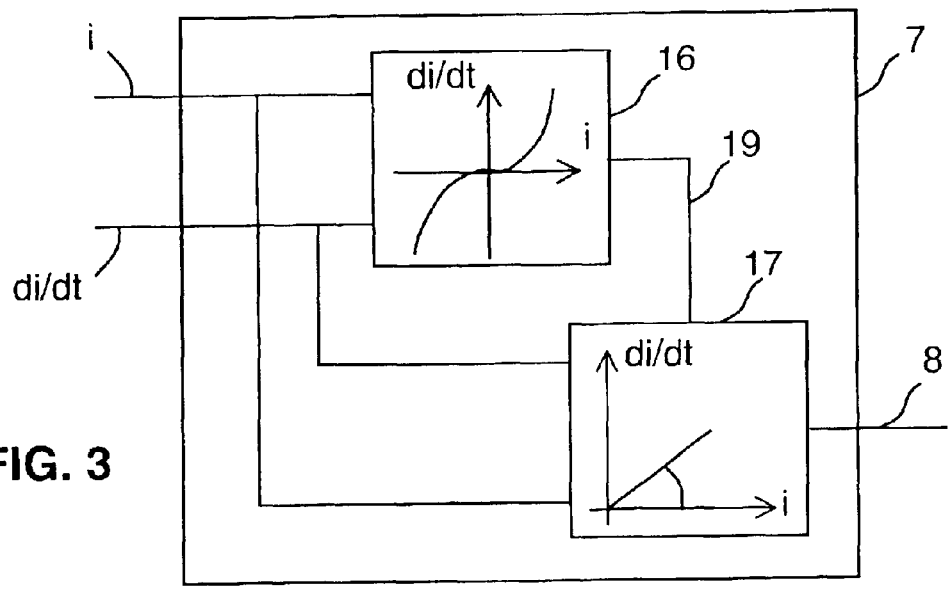
FIG. 3 represents a detection device according to an embodiment of the invention.

The detection device according to an embodiment of the invention represented in FIG. 3 comprises a short-circuit detection processing circuit 7 comprising a first monitoring module 16 to monitor overshoot of a limit curve and a second monitoring module 17 to determine a value representative of a ratio between variations of values depending on the first signal i and the second signal di/dt when the first module 16 has detected a limit curve overshoot. A short-circuit detection signal 8 is supplied if the first monitoring module 16 detects overshoot of said limit curve and if the second monitoring module 17 detects a ratio between the variations of the signals i and di/dt exceeding a preset value.

In the particular embodiment of FIG. 3, the module 16 detects overshoot of a limit curve 18 and supplies a control signal 19 to the circuit 17 to validate computation of a ratio between variations of the signal i and variations of the signal di/dt at a time close to an overshoot time of a limit curve 18. If the ratio exceeds a preset value, a short-circuit detection signal is supplied. The ratio between variations of the signal i and variations of the signal di/dt can be represented in particular by a tangent 22 of a curve 20 representing the signals i and di/dt, by an angle 21 that a tangent 22 forms with a line 26 parallel to the axis 12, or by variations of values between samples of a signal di/dt and variations of values between samples of a signal i at a time close to an overshoot time of the limit curve 18.

Figure 4:
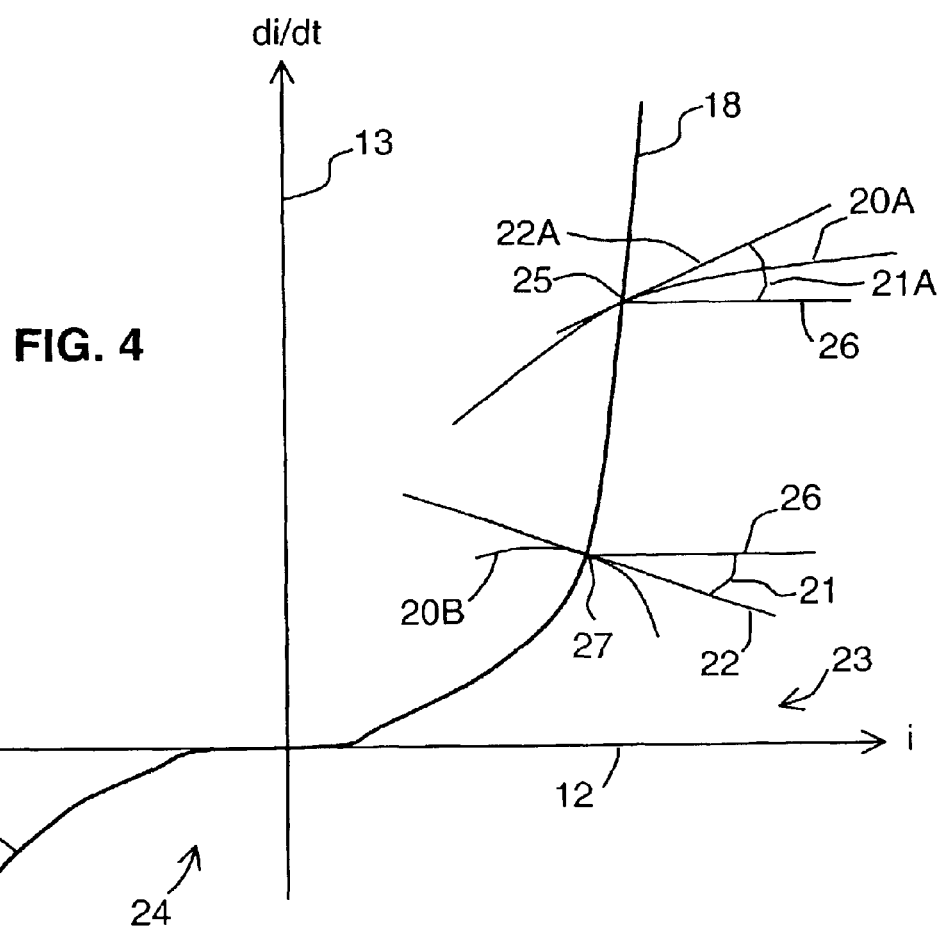
FIG. 4 represents a graph of operation of a detection device according to an embodiment of the invention.

FIG. 4 illustrates operation of a short-circuit detection device according to an embodiment of the invention. A limit curve 18 is defined on a first quadrant 23 and a third quadrant 24 of an orthogonal coordinates system having axes 12 and 13. A first curve 20A representing signals i and di/dt has a strong rise and crosses the curve 18 at a point 25 at an overshoot time. The device then monitors the ratio between variations of the signal di/dt and variations of the signal i. On this curve, the ratio can be represented by a tangent 22A, or an angle 21A between the tangent 22A and a line 26 parallel to the axis 12. In this case, the ratio is high and a short-circuit detection signal 8 is supplied if a preset ratio value is exceeded. For example, a preset ratio threshold value can be zero. This threshold value also corresponds to a threshold tangent or to a threshold angle of preset value zero. A second curve 20B represents another operating situation—it crosses the curve 18 at a point 27. When the overshoot occurs, the ratio between variations of the signal di/dt and variations of the signal i is less than zero. The tangent 22 is negative as is the angle 21. In this case, the ratio is negative and a short-circuit detection signal 8 is not supplied as a preset ratio value is not exceeded.

Figure 5:
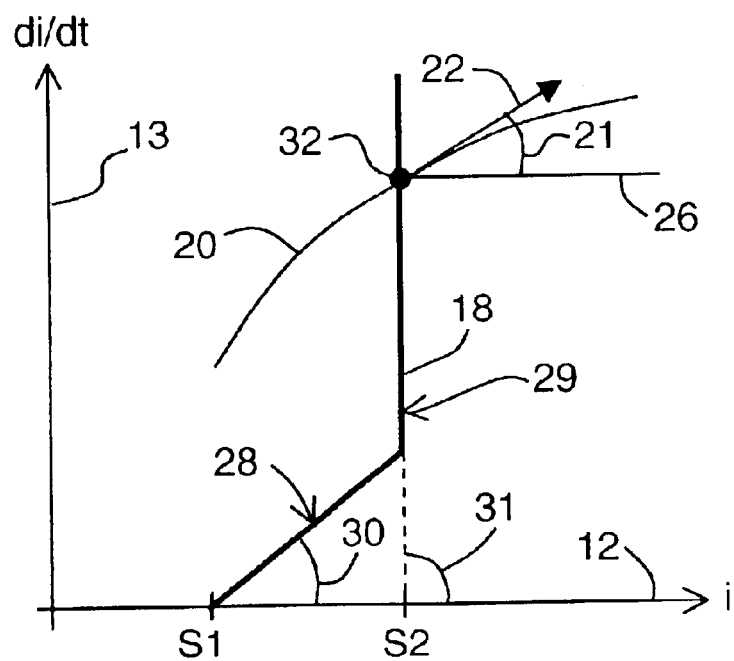
FIG. 5 represents a graph of a limit curve for a device according to an embodiment of the invention comprising two segments.

In FIG. 5, a limit curve 18 is formed by two segments. For example, a first segment 28 starts at a first current threshold S1, ends at a second current threshold S2 and forms a first angle 30 with a first axis 12 representative of current value i. A second segment 29 starts at the second threshold S2 and forms a second angle 31 with the axis 12, the second angle 31 being larger than the first angle 30. In this figure, the curve 20 representing the signals i and di/dt overshoots the limit curve 18 on the second segment 29 at the point 32. At this time, the ratio of the variations of the signals i and di/dt is used to supply a short-circuit detection signal if a threshold is overshot. The variation is able to be represented by the tangent 22 or the angle 21.

Figure 6:
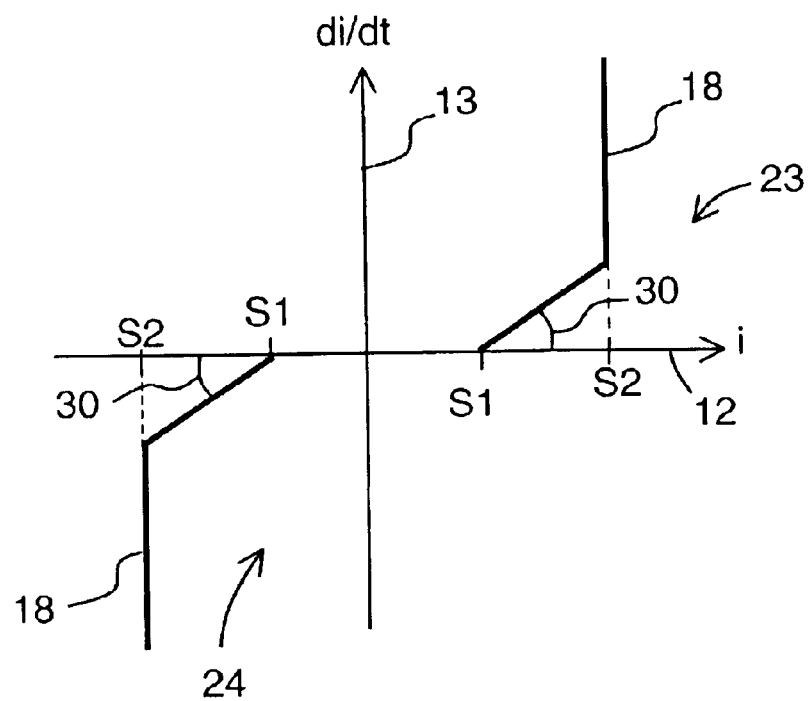
FIG. 6 shows a curve of FIG. 5 represented on two quadrants.

A limit curve 18, represented in FIG. 6, is defined on a first quadrant 23 and on the third quadrant 24 of an orthogonal coordinates system with axes 12 and 13.

Figure 7:
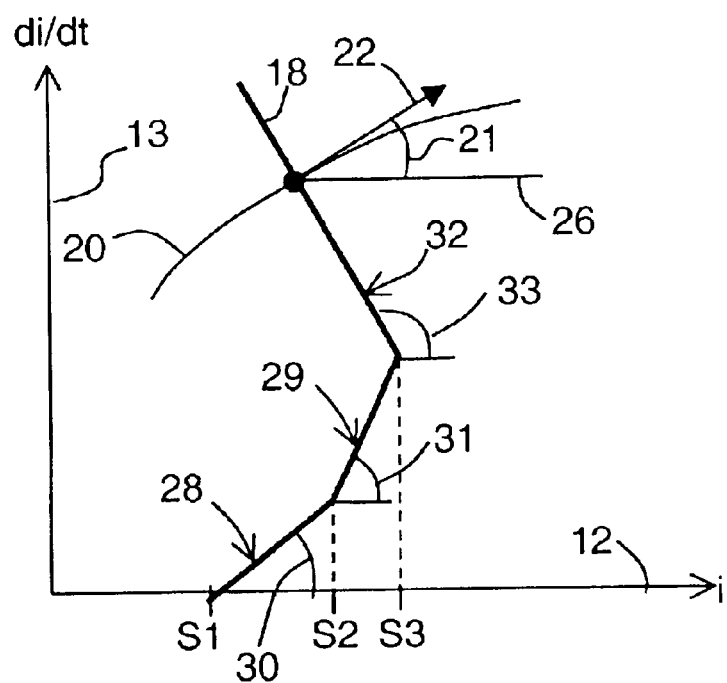
FIG. 7 represents a graph of a limit curve for a device according to an embodiment of the invention comprising three segments.

In FIG. 7, a limit curve 18 is formed by three segments. For example, a first segment 28 starts at a first current threshold S1, ends at a second current threshold S2 and forms a first angle 30 with a first axis 12 representative of current value i. A second segment 29 starts at the second threshold S2, ends at a third threshold S3, and forms a second angle 31 with the axis 12, the second angle 31 being larger than the first angle 30. A third segment 32 starts at the third threshold S3 and forms a third angle 33 with the axis 12 or a line parallel to the axis 12.

Preferably the second angle 31 is larger than the first angle 30 and the third angle 33 is larger than the second angle 31.

Figure 8:
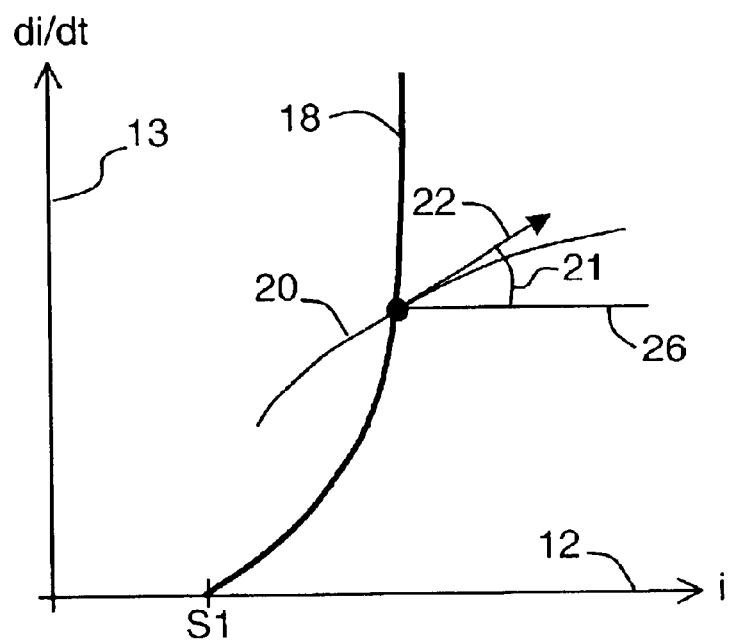
FIG. 8 represents a graph of a limit curve of complex shape for a device according to an embodiment of the invention.

In another embodiment represented in FIG. 8, the limit curve 18 has a complex shape able to be defined by calculation or preferably by a table of predefined couples of points of values of signals i and di/dt.

Figure 9:
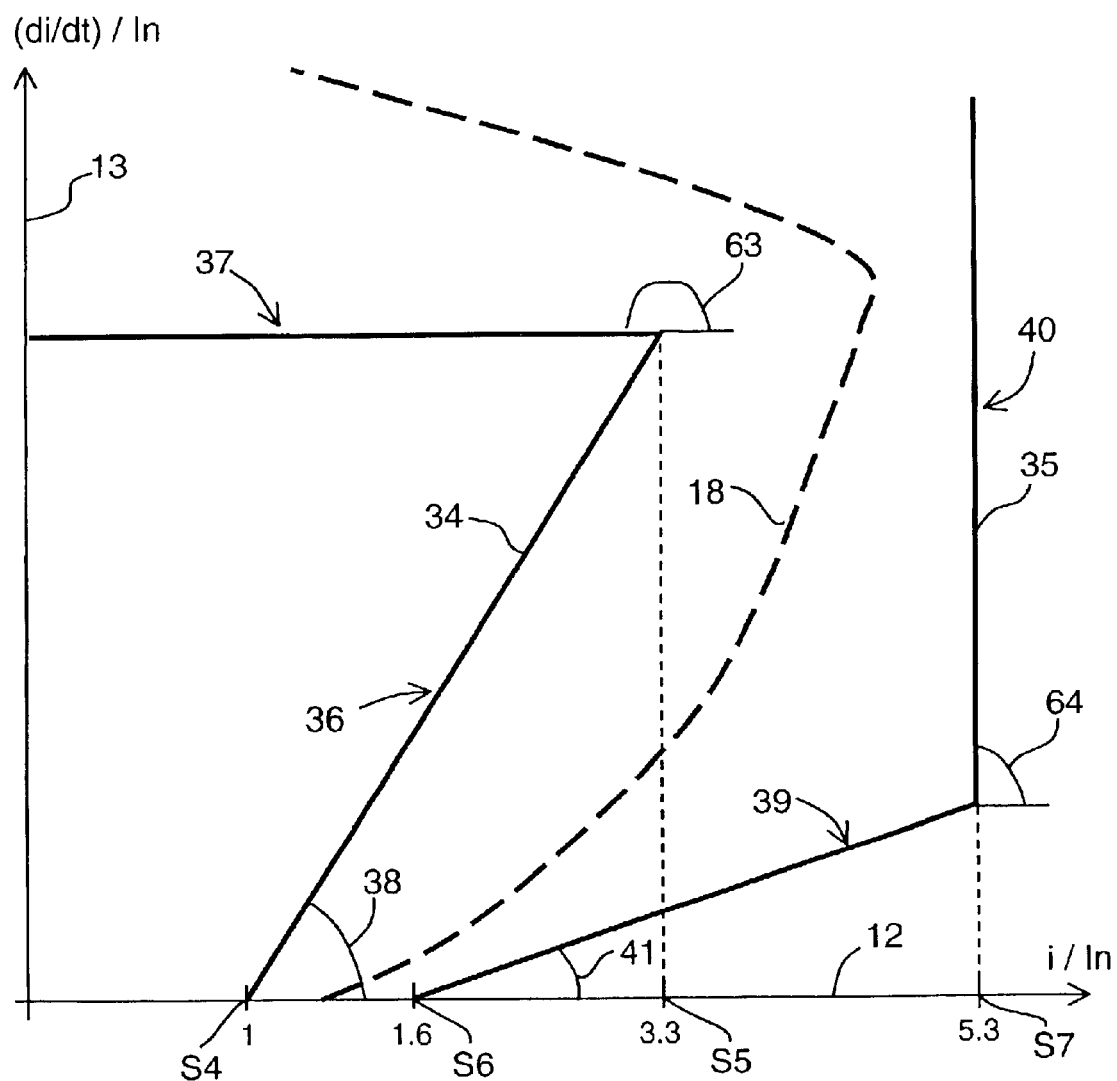
FIG. 9 represents a graph of a limit curve and preferred limit curve bounds.

FIG. 9 shows ranges of preferred values of limit curves 18 represented in an orthogonal coordinates system with axes 12 and 13. The values are normed with respect to a nominal current In able to correspond to a rated current of a protection relay or of a circuit breaker. In this case, the axis 12 bears values of i/In and the axis 13 bears values of (di/dt)/In. In this coordinates system, the limit curve 18 is advantageously contained between bounds formed by two curves 34 and 35.

The first bounding curve 34 comprises two segments 36 and 37. The first segment 34 starts at a first threshold S4 of value 1 located on the axis 12, ends at a second threshold S5 of value 3.3 and forms an angle 38 of 70 degrees with the axis 12. The second segment 37 starts at the second threshold S5 and forms an angle 63 with respect to the axis 12. The second bounding curve 35 comprises two segments 39 and 40. The first segment 34 starts at a first threshold S6 of value 1.6 located on the axis 12, ends at a second threshold S7 of value 5.3, and forms an angle 41 of 30 degrees with the axis 12. The second segment 40 starts at the second threshold S7 and forms an angle 64 with respect to the axis 12. In such a coordinates system, the threshold S1 of a curve 18 is preferably comprised between values 1 and 1.6 i/In. Within the system the curve 18 can have various shapes, for example it can be formed by segments, by geometric shapes such as parabolas or hyperbolas, or by tables of predefined couples of points and interpolations between predefined couples of points.

Figure 10:
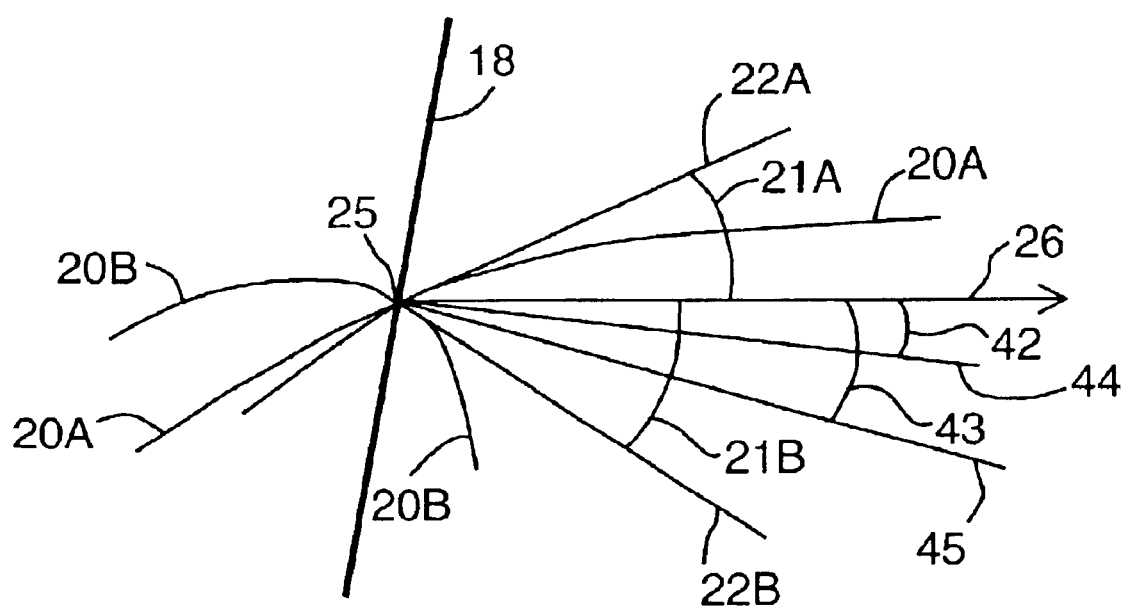
FIG. 10 represents a graph of preferred values of threshold angles and tangents.

For each bounding curve, it is also possible to define an angle threshold to compare the angle 21 or the value of the ratio between variations of the signals di/dt and i and to supply a detection signal if the threshold is exceeded. FIG. 10 shows angle or tangent thresholds able to be used in devices according to embodiments of the invention. For example, for the bounding curve 34 an angle threshold 42 can be −0.1 radians or −5.7 degrees and for the curve 35 an angle threshold 43 can be −0.3 radians or −17 degrees. In FIG. 10, the angle thresholds correspond to tangent thresholds respectively 44 and 45. A first curve 20A representing signals i and di/dt has a tangent 22A larger than the threshold tangents 43 or 44, and an angle 21A larger than the threshold angles 42 or 43. In this case, a short-circuit detection signal can be supplied. A second curve 20B, representing signals i and di/dt, has a tangent 22B smaller than the threshold tangents 43 or 44, and an angle 21B smaller than the threshold angles 42 or 43. In this case, the short-circuit detection signal is not supplied.

The threshold, tangent and angle values of the embodiments described above are defined for a first quadrant of an orthonormed coordinates system, but other values are possible for a third quadrant by adapting the signs of the thresholds, tangents, and angles and also the direction of overshoot to negative values.

Figure 11:
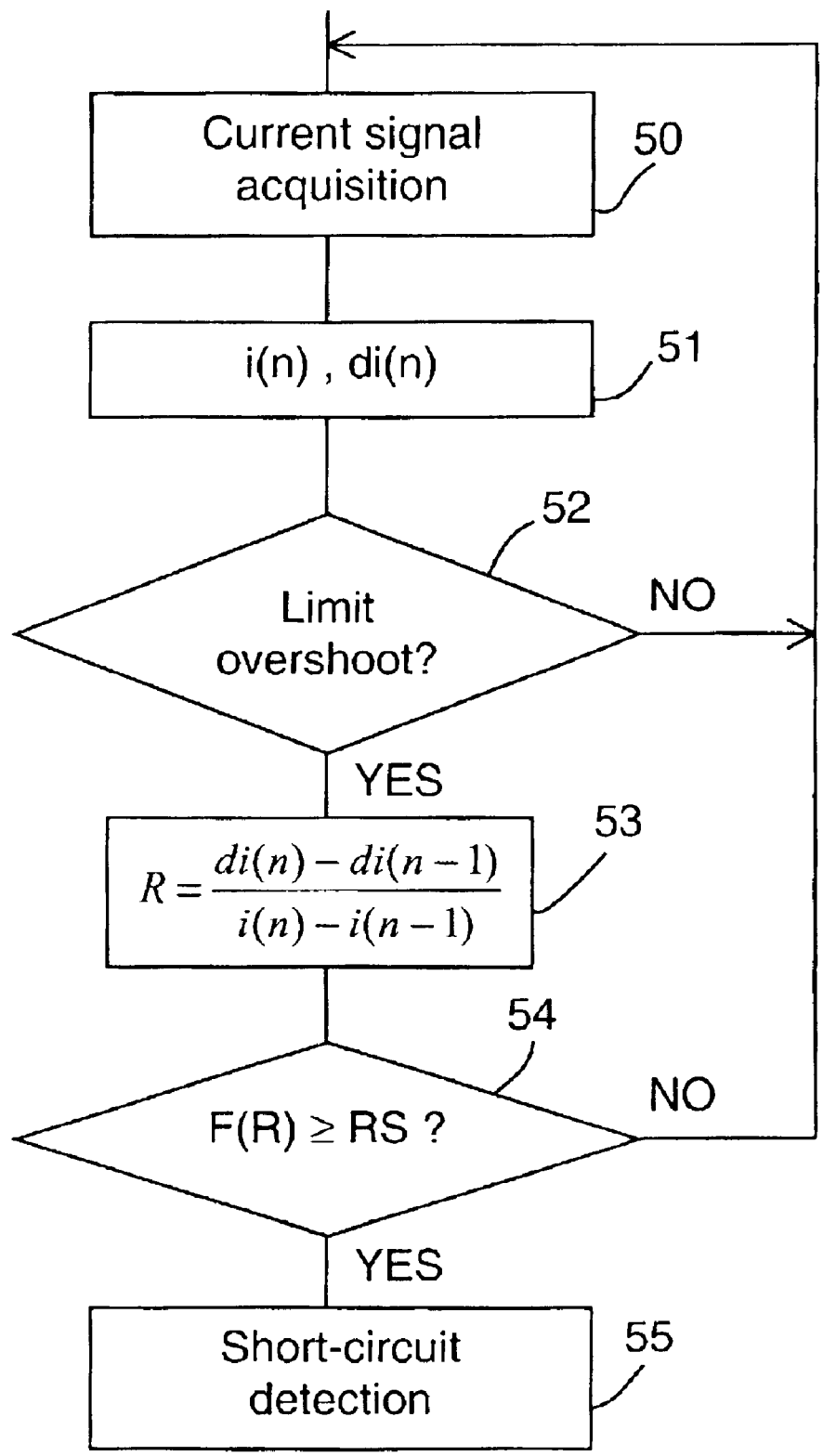
FIG. 11 represents a flowchart of a process for detecting a short-circuit according to an embodiment of the invention.

A flowchart, represented in FIG. 11, shows a short-circuit detection process according to an embodiment of the invention. In this flowchart, a first step 50 performs acquisition of current or current differential signal values. This acquisition can be achieved in the form of sampling by means of a converter. A step 51 enables current values i and current differential values di/dt or corresponding values in samples respectively i(n) and di(n) to be determined. A step 52 monitors overshoot of the limit curve 18 or of couples of limit values by current signals i or i(n) and current differential signals di/dt or di(n). If the step 52 detects an overshoot of the limit curve, a step 53 evaluates a ratio between the variations of the current differential signals and current signals. For example, for sampled signals, the variations can be determined according to previous samples of the current differential and current signals respectively di(n−1) and i(n−1). The current differential variation can thus be expressed by di(n)−di(n−1) and the current variation by i(n)−i(n−1). The expression of the ratio can then be of the form R=((di(n)−di(n−1))/(i(n)−i(n−1))). A step 54 compares the ratio R or a function of the ratio f(R) with a threshold RS. This threshold can also be a tangent threshold if the function f(R) supplies a tangent value or an angle threshold if the function f(R) supplies an angle value. For example, a function f(R) supplying an angle can be formulated by:

$$f(R)=\text{Arc tangent }((di(n)-di(n-1))/(i(n)-i(n-1)))$$

If the threshold RS is exceeded, a step 55 indicates short-circuit detection.

Figure 12:
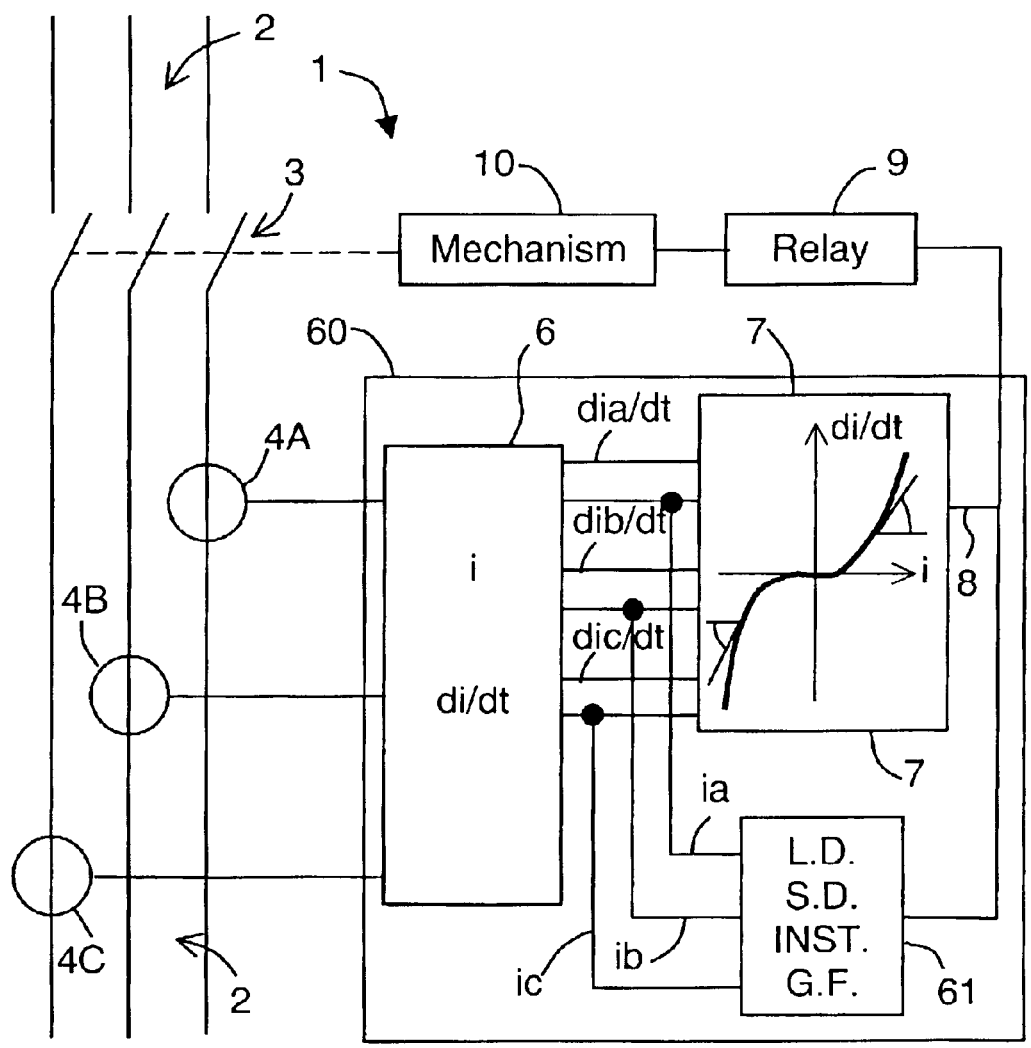
FIG. 12 represents a diagram of a circuit breaker according to an embodiment of the invention comprising a device according to a variant of that of FIG. 3.

FIG. 12 shows a diagram of a circuit breaker according to an embodiment of the invention comprising a short-circuit detection device operating in three-phase.

The circuit breaker 1 comprises main conductors 2 connected to breaking contacts 3 enabling an electrical current to be broken in said conductors 2. Current sensors 4A, 4B, 4C arranged on the conductors 2 enable signals representative of the currents flowing in said conductors to be supplied to a trip device 60. Said trip device 60 comprises a signal processing circuit 6 and a short-circuit detection circuit 7. The circuit 6 receives the signals representative of the currents flowing in the main conductors and is equipped with outputs to supply signals ia, ib, ic representative of the instantaneous values of the currents and signals dia/dt, dib/dt and dic/dt representative of the differentials of said currents to the circuit 7.

Said processing circuit 7 receives the signals ia, ib, ic and dia/dt, dib/dt and dic/dt and supplies a short-circuit detection signal 8 in particular under conditions defined in embodiments described above.

The diagram of FIG. 12 also comprises a tripping function processing circuit 61 receiving current signals ia, ib, ic and/or current differential signals dia/dt, dib/dt and dic/dt. The tripping functions are in particular long delay or thermal, short delay, instantaneous, and/or ground fault protection functions.

The current sensors are preferably Rogowski coil sensors or electrical shunt sensors that enable a fast current response. The circuits can be achieved using discrete components or preferably in soft-wired form and integrated in a microcontroller.

What is claimed is:

1. A device for detecting an electrical short-circuit comprising:

first signal processing means comprising an input for receiving a signal representative of an electrical current, a first output for supplying a first signal representative of the value of such electrical current and a second output for supplying a second signal representative of the differential of such electrical current, and second signal processing means for receiving such a first signal and such a second signal and comprising short-circuit detection means for supplying a short-circuit detection signal when values of such a first signal and such a second signal exceed preset values and thereby define an overshoot point, said second processing means comprising:

first monitoring means for monitoring occurrence of an overshoot point, and second monitoring means for determining when such a first signal processing means detects an overshoot point, a value representative of a ratio between variations of values depending on such a first signal and such a second signal when the first processing means detect an overshoot point, and for supplying a short-circuit detection signal when the first monitoring means detect such an overshoot point and when the second monitoring means detect a ratio between variations exceeding a preset threshold value at the time of, or after, the detection of such an overshoot point.

2. The detection device according to claim 1, wherein said preset threshold value is not greater than zero.

3. The detection device according to claim 1, wherein said value representative of said ratio between variations of values depending on such a first signal and such a second signal is defined by an angle value determined by a tangent at such an overshoot point on the limit curve.

4. The detection device according to claim 1, further comprising means for displaying such first and second signals as a limit curve in a coordinate system, wherein said limit curve comprises at least two segments.

5. The detection device according to claim 4, further comprising means for displaying such first and second signals as a limit curve in a coordinate system, wherein the limit curve comprises:

a first segment beginning at a first current threshold, ending at a second current threshold, and having a first angle with a first axis representative of current value, and a second segment beginning at said second threshold.

6. The detection device according to claim 5, wherein the second segment defines a second angle with the first axis, the second angle being larger than the first angle.

7. The detection device according to claim 1, further comprising means for displaying such first and second signals as a limit curve in a coordinate system, wherein said limit curve begins at a first threshold and is defined by predefined couples of points.

8. The detection device according to claim 1, further comprising means for displaying such first and second signals as a limit curve in a coordinate system, wherein said limit curve passes between bounds defined by a first curve and a second curve, said first curve having a first segment beginning at a first current threshold, ending at a second current threshold, and defining a first angle with a first axis representative of current value, and a second segment beginning at said second threshold and defining a second angle with the first axis, the second angle being larger than the first angle, said second curve having a third segment beginning at a third current threshold, ending at a fourth current threshold, and defining a third angle with a first axis representative of current value, and a fourth segment beginning at said fourth threshold and defining a fourth angle with the first axis, the third threshold being greater than the first threshold, the fourth threshold being greater than the second threshold, and the third angle being smaller than or equal to the first angle.

9. The detection device according to claim 8, wherein said coordinate system is orthonormed with respect to a nominal operating current, wherein:

the first threshold is greater than 1, the second threshold is greater than 3.3, the third threshold is lower than 1.6, the fourth threshold is lower than 5.3, the first angle is smaller than 70 degrees, and the third angle is larger than 30 degrees.

10. The detection device according to claim 1, further comprising means for displaying such first and second signals as a limit curve in a coordinate system, wherein said limit curve is located appreciably symmetrically on a first quadrant of positive current and current differential values, and on a third quadrant of negative current and current differential values.

11. An electrical circuit breaker comprising power contacts for breaking an electrical current in electrical conductors, and an electronic trip device comprising current sensors for supplying signals representative of currents flowing in the electrical conductors, trip function processing means for receiving such signals representative of currents flowing in such electrical conductors and supplying a tripping signal to a trip relay triggering opening of said electrical contacts, wherein the trip device comprises at least one short-circuit detection device according to claim 1, for supplying a tripping signal when a short-circuit is detected.

12. A process for detecting an electrical short-circuit comprising:

first determining a first value of a first signal representative of the value of an electrical current and a second value of a second signal representative of the differential of said electrical current;

representing said first value and said second value for as a limit curve in a coordinate system;

first monitoring for detecting when values of such a first signal and such a second signal exceed preset values as an overshoot point on the limit curve;

second determining a value representative of a ratio between variations of said second value of such a second signal and variations of said first value of such first signal, at the time of the detection of such an overshoot point; and second monitoring the value representative of said ratio between variations to supply a short-circuit detection order if said value representative of a ratio exceeds a preset threshold value at the time of, or after, the detection of such an overshoot point.

13. The detection process according to claim 12, wherein in said second determining comprises determining the value representative of said ratio according to:

a first difference between a second sample of such a second signal close to a time of occurrence of such an overshoot point and one of previous first samples of such a second signal, and a second difference between a second sample of such a first signal close to a time of occurrence of such an overshoot point and one of previous first samples of such first signal.

14. The detection process according to claim 12, wherein in said second determining the value representative of said ratio is representative of a tangent formed approximately at the time the limit curve is crossed by a curve representing such a first signal and such a second signal in a substantially orthogonal coordinate system.

15. The detection process according to claim 12, wherein in said second determining the value representative of said ratio is representative of an angle formed by a vector representative of a tangent approximately at the time the limit curve is crossed by a curve representing a such first signal and such a second signal in substantially orthogonal coordinate system and a vector parallel to an axis representative of current values.

16. The detection process according to claim 12, wherein said first monitoring comprises detecting when values of such a first signal and such a second signal exceed preset values as an overshoot point on a limit curve comprising at least two segments.

17. The detection process according to claim 12, wherein, said first monitoring comprises detecting when values of such a first signal and such a second signal exceed preset values as an overshoot point on a limit curve defined by predetermined couples of points.

* * * * *